(12) United States Patent
Kim

(10) Patent No.: US 7,476,928 B2
(45) Date of Patent: Jan. 13, 2009

(54) FLASH MEMORY DEVICES AND METHODS OF FABRICATING THE SAME

(75) Inventor: Dong-Chan Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 153 days.

(21) Appl. No.: 11/358,897

(22) Filed: Feb. 21, 2006

(65) Prior Publication Data

US 2006/0231822 A1    Oct. 19, 2006

(30) Foreign Application Priority Data

Apr. 4, 2005   (KR)   ...................... 10-2005-0028116

(51) Int. Cl.
*H01L 29/788* (2006.01)
(52) U.S. Cl. .................... 257/314; 257/315; 257/316
(58) Field of Classification Search .......... 257/314–316
See application file for complete search history.

(56) References Cited

U.S. PATENT DOCUMENTS

| 6,121,072 | A | * | 9/2000 | Choi et al. | .................. 438/129 |
|---|---|---|---|---|---|
| 6,337,245 | B1 | * | 1/2002 | Choi | ........................... 438/258 |
| 6,380,032 | B1 | * | 4/2002 | Lee et al. | ..................... 438/257 |
| 6,689,658 | B2 | * | 2/2004 | Wu | .............................. 438/257 |
| 6,765,258 | B1 | * | 7/2004 | Wu | .............................. 257/315 |
| 6,894,341 | B2 | * | 5/2005 | Sugimae et al. | ............. 257/315 |
| 2002/0149081 | A1 | * | 10/2002 | Goda et al. | .................. 257/510 |
| 2003/0030096 | A1 | * | 2/2003 | Hsu | ........................... 257/314 |

FOREIGN PATENT DOCUMENTS

| KR | 1020010054267 A | 7/2001 |
|---|---|---|
| KR | 1020010081246 A | 8/2001 |
| KR | 1020020013193 A | 2/2002 |

* cited by examiner

*Primary Examiner*—Richard Elms
*Assistant Examiner*—Allison P Bernstein
(74) *Attorney, Agent, or Firm*—Myers Bigel Sibley & Sajovec

(57) ABSTRACT

A flash memory device includes a common source region that is disposed in an active region at a side of a ground-selection gate line, being apart from the ground-selection gate line. A pair of source spacers crosses over both top edges of the common source region. A source line fills up a space between the pair of source spacers. The top surface of the source line is equal to or lower than the that of the ground-selection gate line.

7 Claims, 9 Drawing Sheets

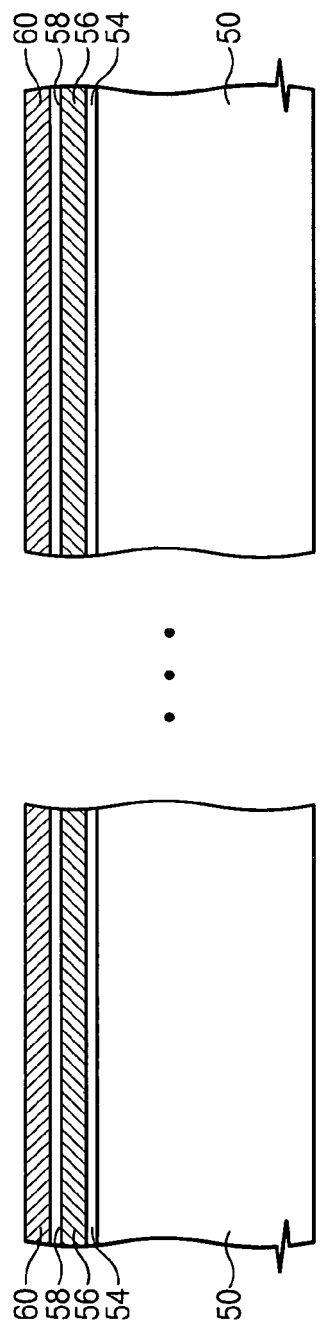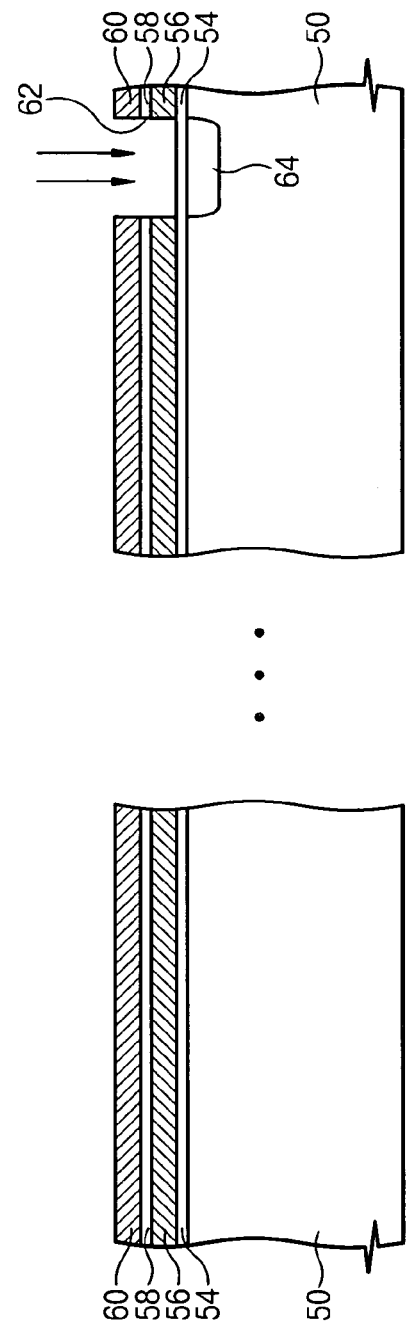

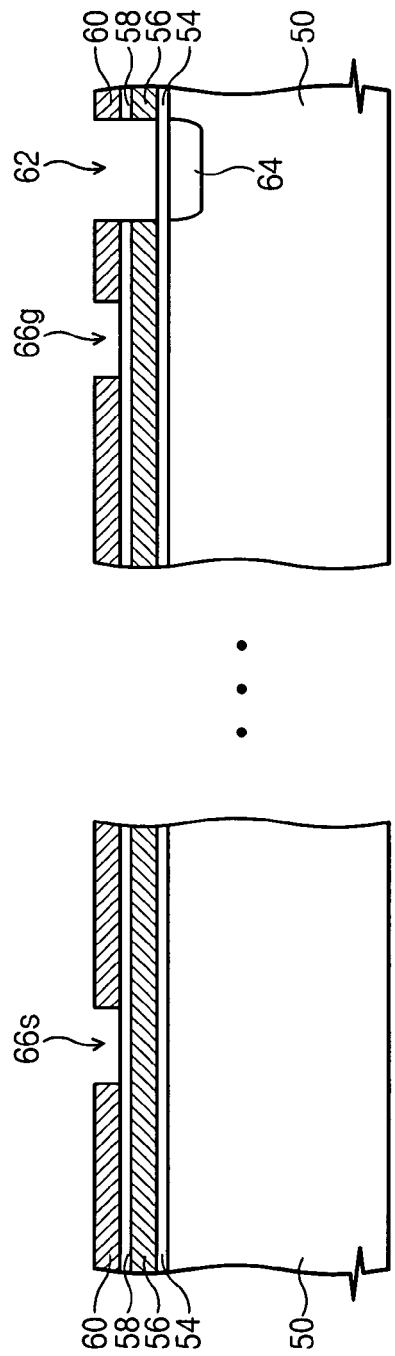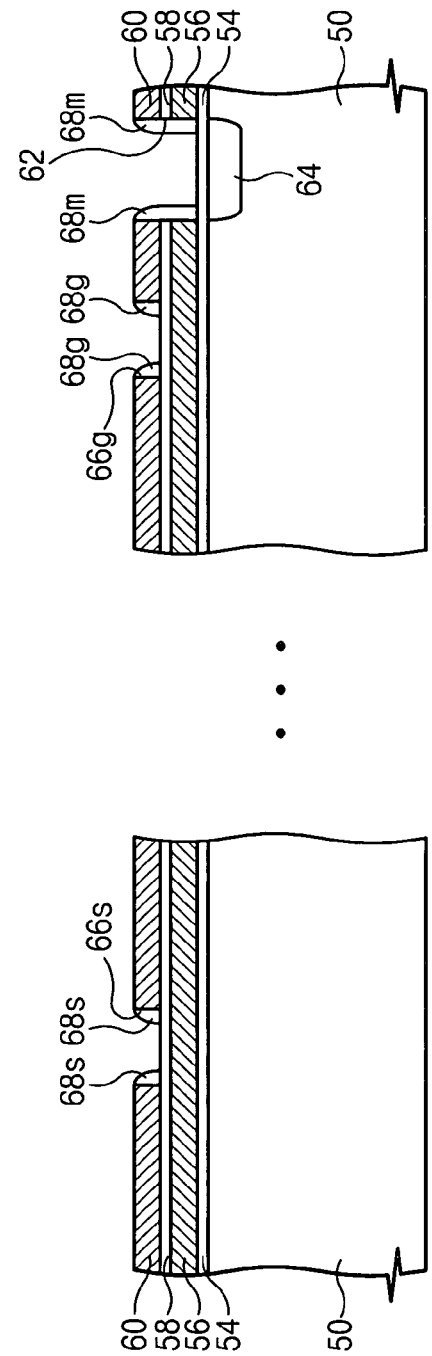

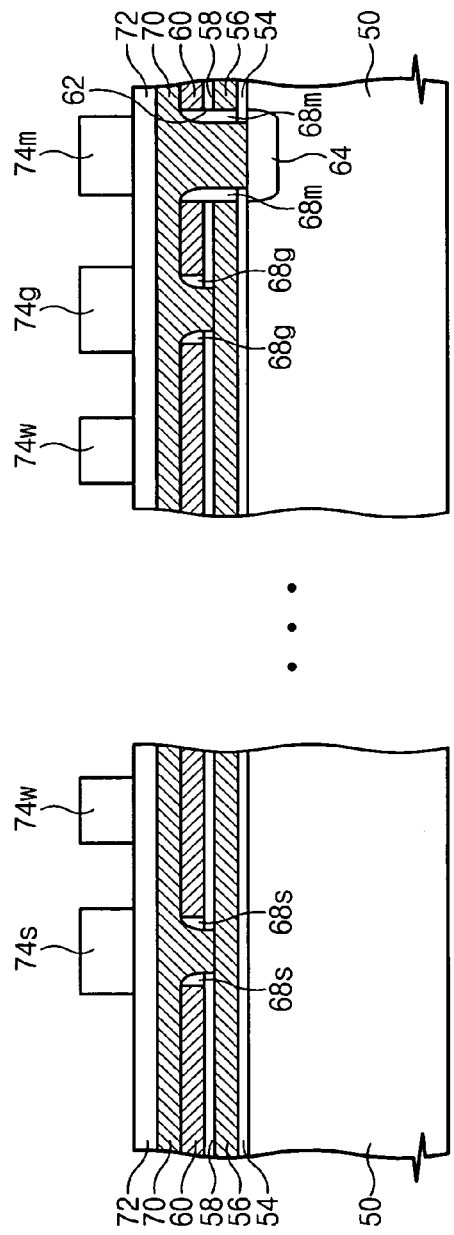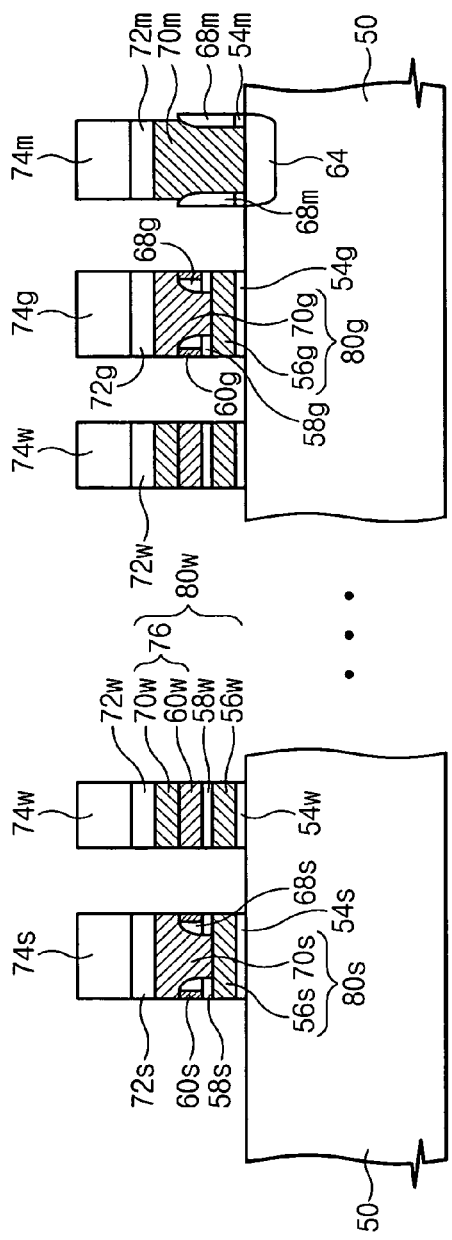

FLASH MEMORY DEVICES AND METHODS OF FABRICATING THE SAME

CROSS-REFERENCE TO RELATED APPLICATIONS

This application claims priority under 35 U.S.C. § 119 from Korean Patent Application No. 2005-28116 filed on Apr. 4, 2005, the disclosure of which is hereby incorporated by reference herein as if set forth in its entirety.

FIELD OF THE INVENTION

The subject matter described herein is concerned with semiconductor devices and, in particular, to flash memory devices and methods of fabricating the same.

BACKGROUND

Flash memory devices are nonvolatile memory devices that retain stored data even when the memory device is not connected to an external power supply. Flash memory devices include both NOR and NAND type flash memories. A conventional NOR-type flash memory device has a memory cell array region that includes a plurality of cell transistors, a plurality of bitlines, and a plurality of source lines. Each cell transistor may be disposed at the intersection of one of the bitlines and one of the source lines. A conventional NAND-type flash memory device has a plurality of cell strings in a cell array region. A unit cell string includes a string selection transistor, a plurality of cell transistors, and a ground selection transistor that are connected in series. The drain of the string selection transistor is connected to a bitline, while the source of the ground selection transistor is connected to a common source region. The cell transistors in the unit cell string are configured to share the single bitline and source region. As such, a conventional NAND-type flash memory device may provide for a higher degree of integration than a conventional NOR-type flash memory device.

FIGS. 1 and 2 are cross-sectional diagrams illustrating a conventional method of fabricating a NAND-type flash memory device. Referring to FIG. 1, field isolation films (not shown) are formed to define active regions in a semiconductor substrate 1. A string-selection gate line 3s, a plurality of cell gate lines 3a, and a ground-selection gate line 3g are formed on the semiconductor substrate 1 to cross over the active regions. The gate lines, 3s, 3a, and 3g, are arranged in parallel with each other. The cell gate lines 3a are disposed between the string-selection gate line 3s and the ground-selection gate line 3g. Each of the cell gate lines 3a includes a tunnel oxide film, a floating gate, an oxide-nitride-oxide (ONO) film, and a control gate that are sequentially stacked on the substrate 1.

Impurity ions are selectively implanted to form a common drain region 5d, cell source/drain regions 5a, and a common source region 5s. The common drain region 5d is formed at one side of the string-selection gate line 3s, the cell source/drain regions 5a are formed at both sides of the cell gate lines 3a, and the common source region 5s is formed at one side of the ground-selection gate line 3g. The gate lines 3s, 3a, and 3g, and the cell source/drain regions 5a are arranged between the common drain region 5d and the common source region 5s.

A first interlayer oxide film 7 is formed on the semiconductor substrate 1. The first interlayer oxide film 7 is patterned to form an opening 9 that exposes the common source region 5s. The opening 9 may be formed in the shape of groove crossing the active region. A conductive film (not shown) may be formed on the semiconductor substrate 1 in order to fill the opening 9. This conductive film is planarized until the first interlevel oxide film 7 is exposed to form a source line 11 in the opening 9.

As shown in FIG. 2, a second interlayer oxide film 13 is deposited over the semiconductor substrate 1. The second and first interlayer films 13 and 7 are patterned to form a bitline contact hole 15 that exposes the common drain region 5d. A contact plug 17 is formed in the bitline contact hole 15, and a bitline 19 is formed on the second interlayer oxide film 13. The bitline 19 is in electrical contact with the contact plug 17.

SUMMARY

Pursuant to embodiments of the present invention, flash memory devices are provided which include at least one active region in a semiconductor substrate, a string-selection gate line that crosses over the active region, a ground-selection gate line that crosses over the active region and a plurality of wordlines that cross over the active region between the string-selection gate line and the ground-selection gate line. The device further includes a common source region in the active region at a first side of the ground-selection gate line and first and second source spacers that cross over top edge regions of the common source region. A source line is provided between the first source spacer and the second source spacer and is electrically connected to the common source region. In these flash memory devices, a height of a top surface of the source line above the semiconductor substrate is less than or equal to a height of a top surface of the ground-selection gate line above the semiconductor substrate.

The width of an upper portion of the source line is less than a distance between an outside wall of the first source spacer and an outside wall of the second source spacer, and greater than a minimum width between an inside wall of the first source spacer and an inside wall of the second source spacer. The first and second source spacers may be formed of an insulation material that has etch selectivity with respect to the string-selection gate line, the ground-selection gate line, the plurality of wordlines and the source line.

In these flash memory devices, the common source region may be spaced-apart from the ground-selection gate line. The device may also include a ground-selection source/drain region in the active region between the ground-selection gate line and the common source region that electrically connects the common source region to a channel region under the ground-selection gate line.

The flash memory device may also include a common drain region in the active region at a first side of the string-selection gate line, and a plurality of cell source/drain regions in the active region arranged so that respective ones of the plurality of cell source/drain regions are provided on each side of each of the plurality of wordlines. An interlevel insulation film may be formed on the string-selection gate line, the ground-selection gate line, the plurality of wordlines and the source line, and a contact plug may be provided that penetrates the interlevel insulation film to make electrical contact with the common drain region. A bitline may be is electrically connected to the contact plug.

In certain embodiments, a diffusion-protecting insulation film may be provided between the interlevel insulation film and the string-selection gate line, the ground-selection gate line, the plurality of wordlines and the source line. In such embodiments, the contact plug penetrates both the interlevel insulation film and the diffusion-protecting insulation film.

The ground-selection gate line may comprise an upper ground-selection gate that is stacked on a lower ground-selection gate. The sting-selection gate line may similarly comprise an upper string-selection gate that is stacked on a lower string-selection gate. The upper string-selection gate and the upper ground-selection gate and the source line may all be formed of the same material. First and second spaced-apart ground selection spacers may be provided on the lower ground-selection gate, and first and second spaced-apart string selection spacers may be provided on the lower string-selection gate. The first and second ground-selection spacers, the first and second string-selection spacers and the first and second source spacers may all be formed of the same material. A lower portion of the upper ground-selection gate may be between the first and second ground-selection spacers, and a lower portion of the upper string-selection gate may be between the first and second string-selection spacers.

In some embodiments, the upper portion of the upper ground-selection gate may be wider than a distance between an outside wall of the first ground selection spacer and an outside wall of the second ground selection spacer. An upper portion of the upper string-selection gate may be wider than a distance between an outside wall of the first string-selection spacer and an outside wall of the second string selection spacer. In other embodiments, an upper portion of the upper ground-selection gate is narrower than a distance between an outside wall of the first ground selection spacer and an outside wall of the second ground selection spacer, but wider than a minimum distance between an inside wall of the first ground selection spacer and an inside wall of the second ground selection spacer. In these embodiments, an upper portion of the upper string-selection gate may also be narrower than a distance between an outside wall of the first string selection spacer and an outside wall of the second string selection spacer, but wider than a minimum distance between an inside wall of the first string selection spacer and an inside wall of the second string selection spacer.

A plurality of conductive patterns may be provided that respectively cover the outside walls of the first and second ground selection spacers and the first and second string selection spacers.

Pursuant to further embodiments of the present invention, flash memory devices are provided that include at least one active region in a semiconductor substrate, a string-selection gate line that crosses over the active region, a ground-selection gate line that crosses over the active region, a plurality of wordlines that cross over the active region between the string-selection gate line and the ground-selection gate line, a common source region in the active region at a first side of the ground-selection gate line, a source line that is electrically connected to the common source region, a first source spacer that crosses over a first top edge region of the common source region and a second source spacer that crosses over a second top edge region of the common source region. A lower portion of the source line is between the first source spacer and the second source spacer.

Pursuant to still further embodiments of the present invention, methods of fabricating flash memory devices are provided in which a gate insulation film, a preliminary floating gate, a blocking insulation film and a first conductive film are sequentially formed on a semiconductor substrate. The first conductive film, the blocking insulation film and the preliminary floating gate are then patterned to form a source opening that exposes the semiconductor substrate. Impurity ions are implanted into the semiconductor substrate exposed by the source opening to form a common source region. A first source spacer is formed on a first sidewall of the source opening and a second source spacer is formed on a second sidewall of the source opening. A second conductive film is formed on the semiconductor substrate between the source spacers to be electrically connected to the common source region. Finally, the second conductive film, the first conductive film, the blocking insulation film and the preliminary floating gate are patterned using the source spacers as etch-stopping layers to form a string-selection gate line, a plurality of wordlines, a ground-selection gate line and a source line, where the source line is formed in a region between an outside wall of the first source spacer and an outside wall of the second source spacer.

BRIEF DESCRIPTION OF THE FIGURES

The accompanying drawings, which are included to provide a further understanding of the invention and are incorporated in and constitute a part of this application, illustrate certain embodiment(s) of the invention. In the drawings:

FIGS. 6 through 12 are cross-sectional diagrams, taken along the line I-I' of FIG. 3, illustrating methods for forming flash memory devices according to certain embodiments of the present invention.

DETAILED DESCRIPTION

Figure 1:
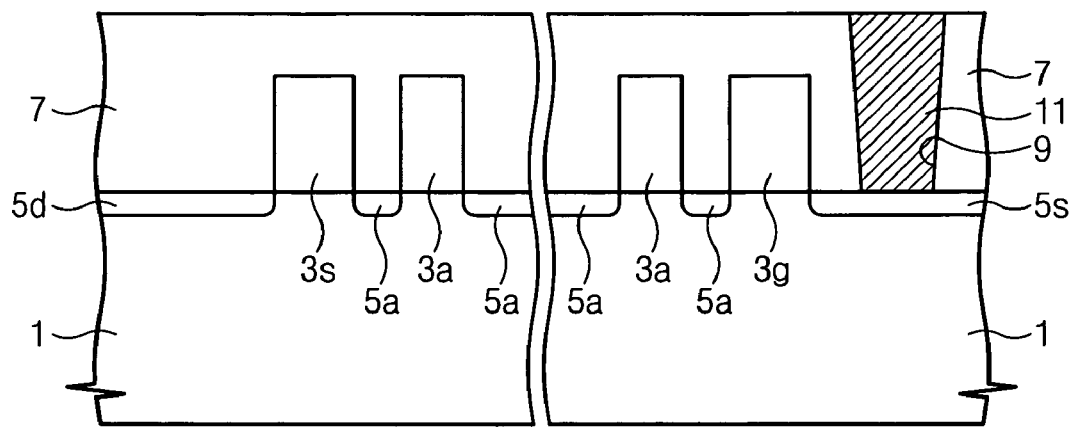
FIGS. 1 and 2 are cross-sectional diagrams of a conventional NAND-type flash memory device.

Embodiments of the present invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", "adjacent" versus "directly adjacent", "connected" versus "directly connected", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

Herein, references are made to active regions that are formed or defined in a "semiconductor substrate." It will be understood that the term "semiconductor substrate" is used broadly to refer to any semiconductor layer that includes an active region, and thus the term "semiconductor substrate" will encompass, for example, silicon-on-insulator (SOI) and similar structures that have a semiconductor layer on an insulating substrate, and form the active regions in the semiconductor layer.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 3:
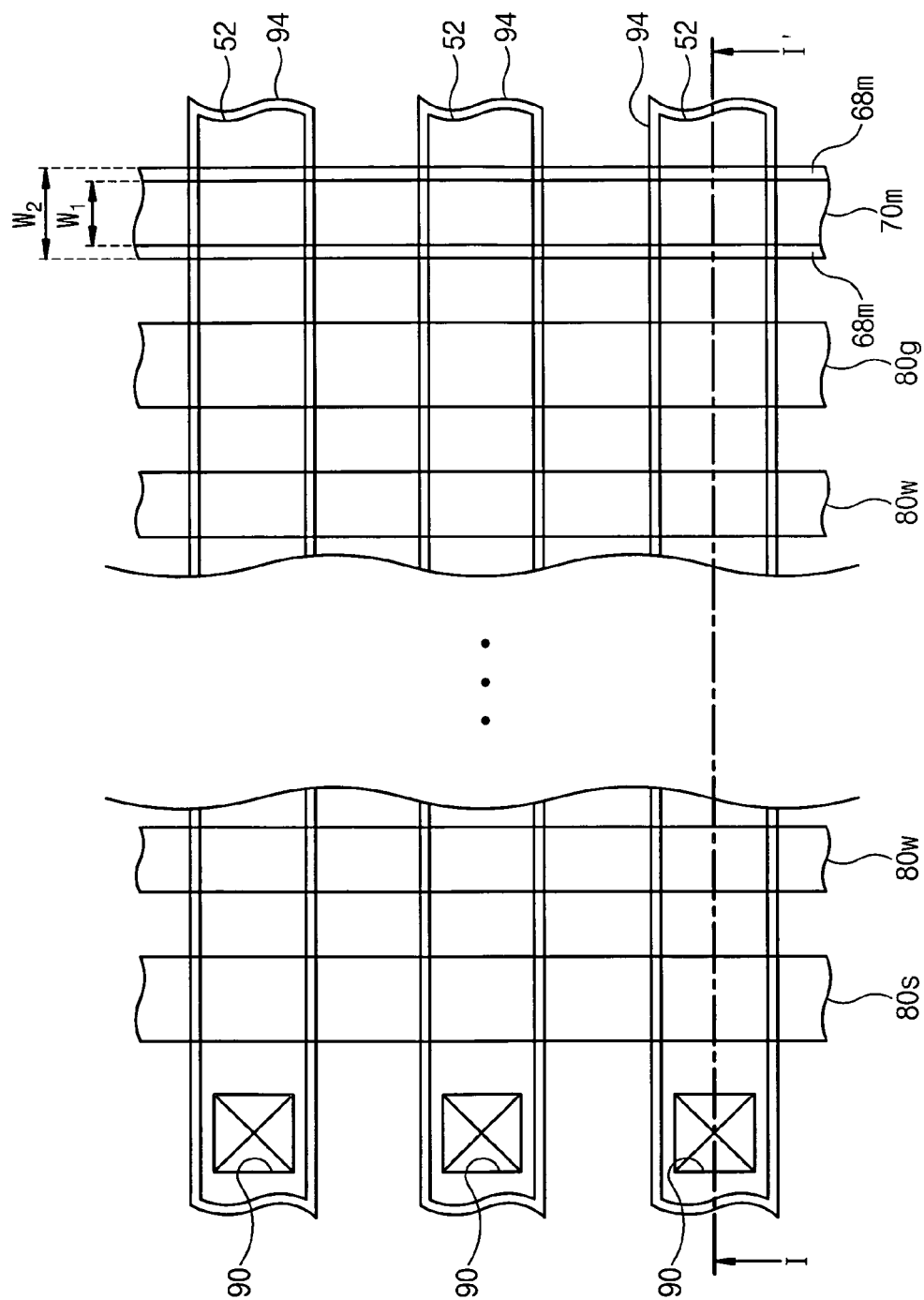
FIG. 3 is a plan view of a flash memory device in accordance with embodiments of the present invention.

FIG. 3 is a plan view illustrating a flash memory device in accordance with embodiments of the present invention. As shown in FIG. 3, a field isolation film is provided on a semiconductor substrate 50 to define a plurality of active regions 52. The active regions 52 may be line-shaped and may be disposed in parallel with each other. A string-selection gate line 80s and a ground-selection gate line 80g are provided, each of which cross over the active regions 52. A plurality of wordlines 80w are provided between the string-selection gate line 80s and the ground-selection gate line 80g. The wordlines 80w likewise cross over the active regions 52. The string-selection gate line 80s, the ground-selection gate line 80g, and the wordlines 80w are arranged in parallel.

Figure 4:
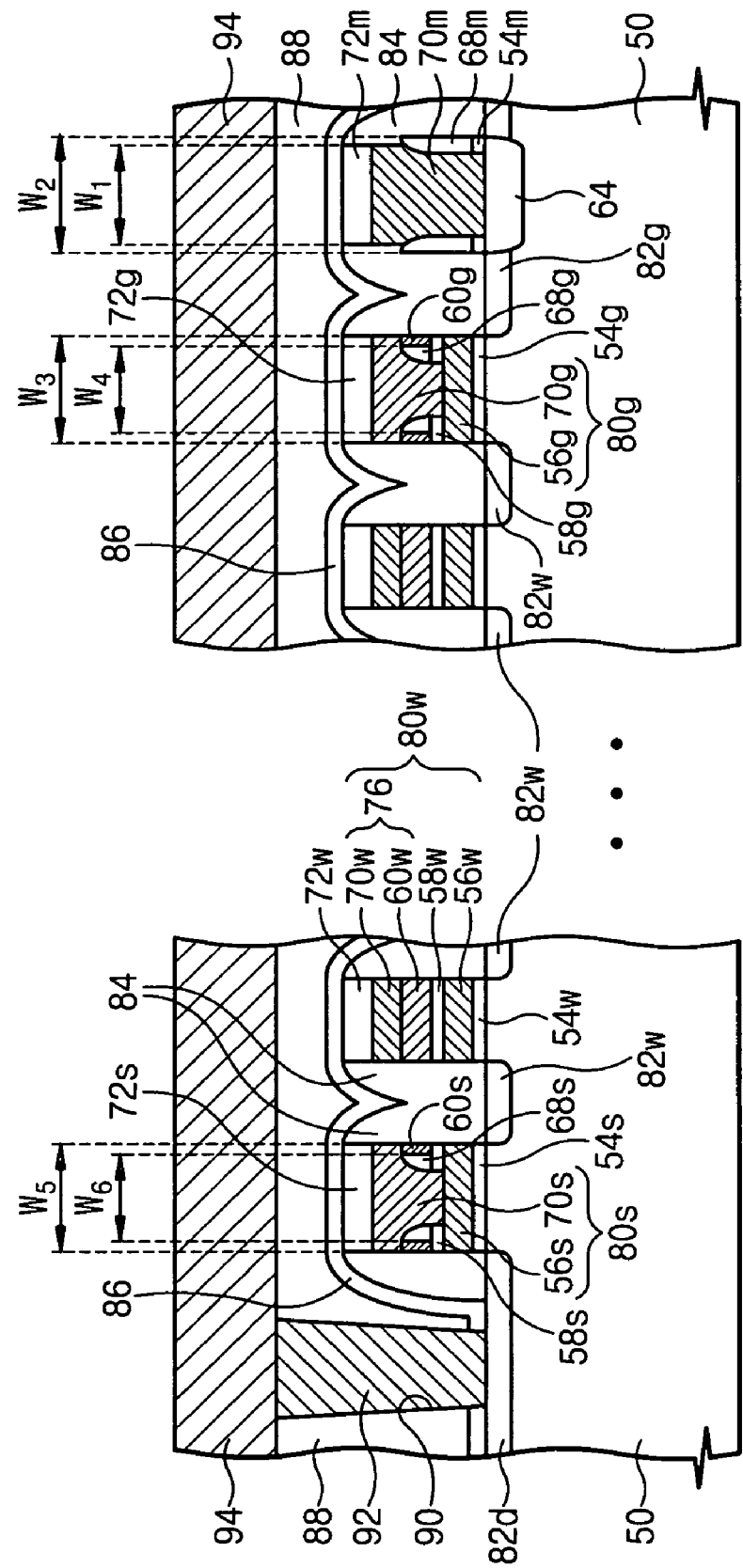
FIG. 4 is a cross-sectional diagram taken along the line I-I' of FIG. 3 according to certain embodiments of the present invention.

Certain embodiments of the flash memory device of FIG. 3 will now be described in more detail with respect to FIG. 4, which is a cross-sectional diagram taken along with the line I-I' of FIG. 3 (i.e., along one of the active regions 52). As shown in FIG. 4, a string-selection gate insulation film 54s is interposed between the string-selection gate line 80s and the active region 52. Likewise, a ground-selection gate insulation film 54g is interposed between the ground-selection gate line 80g and the active region 52. A tunnel insulation film 54w is interposed between each wordline 80w and the active region 52. The string-selection gate insulation film 54s, the ground-selection gate insulation film 54g, and the tunnel insulation films 54w may be formed of the same material. In some embodiments, the string-selection gate insulation film 54s, the ground-selection gate insulation film 54g, and the tunnel insulation films 54w may each have the same thickness. In other embodiments, the string-selection gate insulation film 54s, the ground-selection gate insulation film 54g, and the tunnel insulation films 54w may have different thicknesses. For example, the string and ground-selection gate insulation films 54s and 54g may be thicker than the tunnel insulation film 54w.

Each of the wordlines 80w may include a floating gate 56w, a blocking insulation pattern 58w and a control gate electrode 76 that are sequentially stacked on the active region 52. The control gate electrode 76 may include a lower control gate 60w and an upper control gate 70w that is stacked on the lower control gate 60w. The control gate electrode 76 crosses over the active region 52. Each floating gate 56w is spaced from adjacent floating gates along the row and column directions. The floating gate 56w is electrically isolated from the active region 52 by the tunnel insulation film 54w, and is isolated from the control gate electrode 76 by the blocking insulation pattern 58w.

The string-selection gate line 80s includes a lower string-selection gate 56s and an upper string-selection gate 70s that is stacked on the lower string-selection gate 56s. The upper string-selection gate line 70s may contact a top surface of the lower string-selection gate 56s. The upper string-selection gate 70s may be line-shaped crossing over the active regions 52 (see FIG. 3). A plurality of the lower string-selection gates 56s may be disposed each at positions intersecting the upper string-selection gate 70s and the active regions 52.

The ground-selection gate line 80g comprises a lower ground-selection gate 56g and an upper ground-selection gate 70g that is stacked on the lower ground-selection gate 56g. The upper ground-selection gate 70g may contact a top surface of the lower ground-selection gate 56g. The upper ground-selection gate 70g may be line-shaped crossing over the active regions 52. A plurality of the lower ground-selection gates 56g may be disposed each at positions intersecting the upper ground-selection gate 70g and the active regions 52.

A common source region 64 is disposed in the active region at the side of the ground-selection gate line 80g that is opposite the wordlines 80w. The common source region 64 may comprise an impurity doped region that is formed by an ion-implantation process. A pair of source spacers 68m cross over respective top edges of the common source region 64. As shown best in FIG. 3, the pair of source spacers 68*m* may cross over the plurality of the common source regions 64 that are formed in the plurality of active regions 52. The pair of source spacers 68*m* are parallel to, and spaced apart from, each other.

A source line 70*m* is disposed between the pairs of source spacers 68*m*. The source line 70*m* may directly contact the common source region 64 between the pair of source spacers 68*m*. As shown best in FIG. 3, the source line 70*m* extends along the pair of source spacers 68*m*, contacting each of the plurality of common source regions 64 in the plurality of active regions 52. The source line 70*m* includes a lower portion that is between the pair of source spacers 68*m*, and an upper portion that protrudes from the lower portion. A top surface of the source line 70*m* is higher than the highest portions of the source spacers 68*m*.

The common source region 64 is spaced apart from the ground-selection channel region that is under the ground-selection gate line 80*g*. Thus, the source line 70*m* and the pair of the source spacers 68*m* are spaced apart from the ground-selection gate line 80*g*. A ground-selection source/drain region 82*g* is disposed in the active region 52 between the ground-selection channel region and the common source region 64. When the ground selection transistor is turned on, the ground-selection source/drain region 82*g* electrically connects the ground-selection channel region to the common source region 64.

A common drain region 82*d* is disposed in the active region 52 at the side of the string-selection gate line 80*s* opposite the wordlines 80*w*. The string-selection gate line 80*s* is disposed between the common drain region 82*d* and the wordlines 80*w*. The common drain region 82*d* is connected to a string-selection channel region that is defined under the string-selection gate line 80*s*. Thus, when the string selection transistor is turned on, the string-selection channel region is electrically connected to the common drain region 82*d*.

Cell source/drain regions 82*w* are disposed in the active region 52 at both sides of each wordline 80*w*. The cell source/drain region 82*w* that is located between the string-selection gate line 80*s* and the wordline 80*w* that is adjacent to the string-selection gate line 80*s* is shared by the string-selection transistor and the cell transistor. The cell source/drain region 82*w* that is located between the ground-selection gate line 80*g* and the wordline 80*w* that is adjacent to the ground-selection gate line 80*g* is shared by the cell transistor and the ground-selection transistor.

The portion of the source line 70*m* that contacts the common source region 64 may be formed, for example, of doped polysilicon. The source line 70*m* may further include a conductive material having low specific resistance such as, for example, a metal (e.g., tungsten or molybdenum), a conductive metal nitride (e.g., titanium nitride or tantalum nitride), or a metal silicide (e.g., tungsten silicide or cobalt silicide). This may further lower the resistance of the source line 70*m*, which may allow the flash memory device to operate at higher speeds.

The lower string-selection gate 56*s*, the lower ground-selection gate 56*g*, and the floating gates 56*w* may be formed of the same material (e.g., doped polysilicon). Likewise, the upper string-selection gate 70*s*, the upper ground-selection gate 70*g*, the upper control gates 70*w* and the source line 70*m* may be formed of the same material.

In certain embodiments of the present invention, the top surface of the source line 70*m* is no higher than the top surfaces of the selection gate lines 80*s* and 80*g* and the wordlines 80*w*. This configuration may reduce and/or minimize the elevation rate of the aspect ratio of the bitline contact hole, which may make it easier to form the bitline contact hole.

The source spacer 68*m* may be formed of a insulation material having etching selectivity with respect to the string-selection gate line 80*s*, the ground-selection gate line 80*g*, the wordlines 80*w* and the source line 70*m*. In certain embodiments, the source spacer 68*m* may be formed of silicon nitride or silicon oxy-nitride.

The upper portion of the source line 70*m* has a first width $W_1$ while the outside walls of the pair of source spacers 68*m* are spaced apart from each other by a second width $W_2$. The pair of source spacers 68*m* may be symmetrical to each other. The first width $W_1$ may be narrower than the second width $W_2$. The first width $W_1$ may be wider than the minimum width between inside walls of the pair of source spacers 68*m* (i.e., the width of the source line 70*m* at the interface between the source line 70*m* and the common source region 64 in FIG. 4).

A buffer insulation pattern 54*m* may be disposed between each source spacer 68*m* and the active region 52. The buffer insulation pattern 54*m* may comprise a silicon oxide pattern. If the source spacer 68*m* is formed of a silicon nitride, the buffer insulation pattern 54*m* may lessen the stress between the source spacer 68*m* and the active region 52.

A pair of laterally spaced-apart ground selection spacers 68*g* may be disposed on the top surface of the lower ground-selection gate 56*g*. The ground selection spacers 68*g* may be parallel to the source spacers 68*m*. The upper ground-selection gate 70*g* includes a lower portion that is disposed on the ground selection gate 56*g* between the pair of ground selection spacers 68*g*, and an upper portion that protrudes upward from the lower portion.

The upper portion of the upper ground-selection gate 70*g* has a third width $W_3$. The outside walls of the spaced apart pair of ground selection spacers 68*g* are spaced apart by a fourth width $W_4$. As illustrated in FIG. 4, the third width $W_3$ may be wider than the fourth width $W_4$. The lower ground-selection gate 56*g* may have sidewalls that are aligned with the sidewalls of the upper portion of the upper ground-selection gate 70*g*. Thus, the width of the lower ground-selection gate 56*g* may also be the third width $W_3$. A first conductive pattern 60*g* including a ground selection opening may be interposed between the lower ground selection gate 56*g* and the upper ground-selection gate 70*g*. The pair of ground selection spacers 68*g* are disposed on respective of the inside walls of the ground selection opening in the first conductive pattern 60*g*. The first conductive pattern 60*g* has outside walls aligned to sidewalls of the lower and upper ground-selection gates 56*g* and 70*g*. A first insulation pattern 58*g* may be interposed between each ground selection spacer 68*g* and the lower ground selection gate 56*g*, and between each first conductive pattern 60*g* and the lower ground selection gate 56*g*. The first insulation pattern 58*g* has sidewalls aligned to the sidewalls of the lower and upper ground-selection gates 56*g* and 70*g*.

A pair of string selection spacers 68*s* are similarly disposed on the lower string-selection gate 56*s*. The string selection spacers 68*s* are spaced apart from each other, and are parallel to the source spacers 68*m*. The upper string-selection gate 70*s* includes a lower portion on the string-selection gate 56*s* between the pair of string selection spacers 68*s*, and an upper portion that protrudes upward from the lower portion.

The upper portion of the upper string-selection gate 70*s* has a fifth width $W_5$. The pair of string selection spacers 68*s* may be symmetrical to each other. The outside walls of the pair of string selection spacers 68*s* are spaced apart from each other by a sixth width $W_6$. The fifth width $W_5$ may be wider than the sixth width $W_6$. The sidewalls of the lower string-selection gate 56s may be aligned with the sidewalls of the upper string-selection gate 70s (i.e., the lower string-selection gate 56s may also have the fifth width $W_5$). A second conductive pattern 60s may also be interposed between each the lower string-selection gate 56s and upper string-selection gate 70s (in addition to the pair of string selection spacers 68s). A string selection opening penetrates the second conductive pattern 60s, and the pair of string selection spacers 68s are disposed on respective inside walls of the string selection opening. The outside walls of the second conductive pattern 60s may be aligned with the sidewalls of the lower and upper string-selection gates 56s and 70s. The fifth and sixth widths $W_5$ and $W_6$ may be equal to the third and fourth widths $W_3$ and $W_4$, respectively. A second insulation pattern 58s may be interposed between each string selection spacer 68s and the lower string-selection gate 56s, and between the second conductive pattern 60s and the lower string-selection gate 56s. The outside walls of the second insulation pattern 58s may be aligned to the sidewalls of the lower and upper string-selection gates 56s and 70s.

The ground and string selection spacers 68g and 68s may be formed of the same material as the source spacers 68m. The first and second conductive patterns 60g and 60s may be formed of the same material as the lower control gates 60w. The first and second insulation patterns 58g and 58s may be formed of the same material as the blocking insulation patterns 58w.

A source-line capping pattern 72m is disposed on the source line 70m. A ground-line capping pattern 72g is disposed on the ground-selection gate line 80g. A wordline capping pattern 72w is disposed on each wordline 80w. A string-selection capping pattern 72s is disposed on the string-selection gate line 80s. The capping patterns 72m, 72g, 72w, and 72s may be formed of the same material such as, for example, silicon oxide, silicon oxy-nitride, or silicon nitride, and may be formed in a single step.

Gate spacers 84 may be formed on sidewalls of the selection gate lines 80s and 80g, the wordlines 80w, the source line 70m, and the capping patterns 72m, 72g, 72w, and 72s. As illustrated in FIG. 4, the gate spacers 84 in the gap regions between the wordlines 80w may contact each other. The gate spacers 84 in the gap region between the selection gate line 80s and the wordline 80w adjacent thereto may also be in contact, as may the gate spacers 84 in the gap region between the selection gate line 80g and the wordline 80w adjacent thereto. In addition, the gate spacers 84 in the gap region between the ground-selection gate line 80g and the source line 70m may be in contact with each other. Such a configuration may facilitate increasing the integration level of the flash memory device. The gate spacers 84 may be formed of an insulation material such as, for example, silicon oxide.

A diffusion-protecting insulation film 86 may cover the selection gate lines 80s and 80g, the wordlines 80w, and the capping patterns 72m, 72g, 72w and 72s. The diffusion-protecting insulation film 86 may reduce the ability of any mobile charges from infiltrating into the floating gate. Mobile charges that may be present may include natrium ions, aluminum ions, copper ions and/or kalium ions that may be generated during the formation of metal films during subsequent processing steps. Such mobile charges may result in defects in the flash memory device, being induced by charges stored in the floating gates 56w. The diffusion-protecting insulation film 86 may reduce and/or minimize the inducement of the mobile charges toward the floating gates 56w. The diffusion-protecting insulation film 86 may be made, for example, of silicon nitride and/or silicon oxy-nitride.

An interlevel insulation film 88 may be formed on the diffusion-protecting insulation film 86. The interlevel insulation film 88 may be formed, for example, of silicon oxide. A contact plug 92 is formed in a bitline contact hole 90 that penetrates the interlevel insulation film 88 and the diffusion-protecting insulation film 86 to expose the common drain region 82d. A bitline 94 is disposed on the interlevel insulation film 88. The bitline 94 is in electrical contact with the contact plug 92. The bitline 94 is thus electrically connected to the common drain region 82d by way of the contact plug 92. The bitline 94 intersects the selection gate lines 80s and 80g, the wordlines 80w, and the source line 70m.

As noted above, in the flash memory device of FIG. 4, the top surface of the source line 70m is no higher than the top surfaces of the selection gate lines 80s and 80g and the wordlines 80w.

Additionally, the lower portion of the source line 70m is between the spaced-apart pair of source spacers 68m. The width of the upper portion of the source line 70m may be smaller than the distance between the outside walls of the pair of the source spacers 68m. As such, the source line 70m may be sufficiently spaced from the ground-selection gate line 80g, which may reduce the possibility of a short circuit between the source line 70m and the ground-selection gate line 80g.

Figure 5:
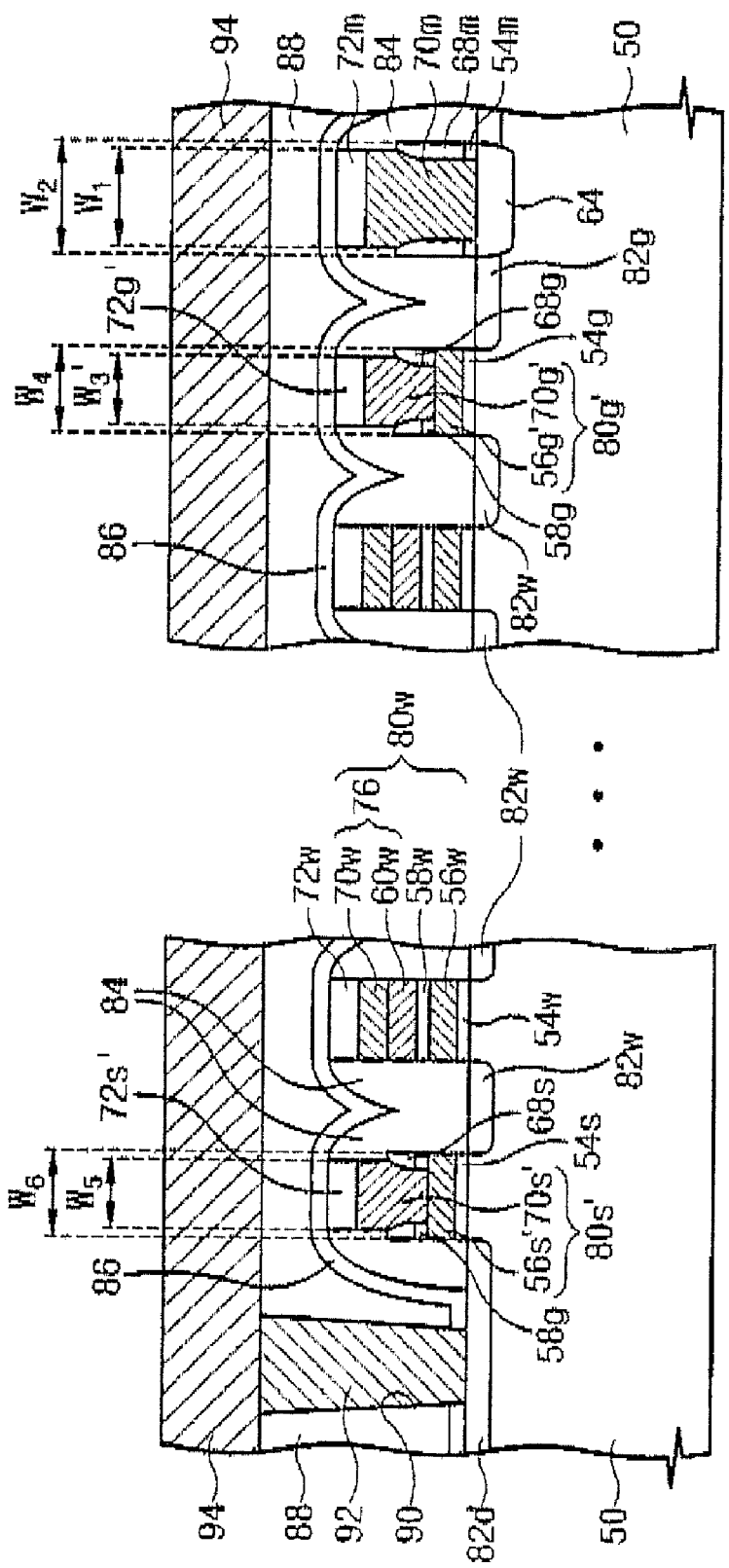
FIG. 5 is a cross-sectional diagram taken along the line I-I' of FIG. 3 according to further embodiments of the present invention.

FIG. 5 is a cross-sectional diagram, taken along the line I-I' of FIG. 3, illustrating flash memory devices pursuant to further embodiments of the present invention in which the selection gate lines have a different configuration than the embodiments of the present invention depicted in the flash memory devices of FIG. 4. In FIG. 5, like elements are numbered the same as in FIG. 4.

As shown in FIG. 5, the ground-selection gate line 80g' may comprise a lower ground-selection gate 56g' and an upper ground-selection gate 70g'. A pair of ground-selection spacers 68g are disposed on the lower ground-selection gate 56g'. The ground selection spacers 68g are parallel to the source spacers 68m. The lower portion of the upper ground-selection gate 70g' is between the ground selection spacers 68g, and may directly contact the lower ground-selection gate 56g'. The upper portion of the upper ground-selection gate 70g may extend above the top surfaces of the ground-selection spacers 68g.

As shown in FIG. 5, the upper portion of the upper ground-selection gate 70g' may have a third width $W_3'$. The third width $W_3'$ is narrower than a fourth width $W_4$ that is the width between the outside walls of the pair of the ground selection spacers 68g. The third width $W_3'$ may be larger than the minimum interval between the inside walls of the pair of the ground selection spacers 68g (i.e., the width of a bottom surface of the upper ground-selection gate 70g). The lower ground-selection gate 56g may have sidewalls that are aligned with the outside walls of the ground selection spacer 68g such that the width of the lower ground-selection gate 56g may be equal to the fourth width $W_4$. A ground-selection capping pattern 72g may be disposed on the upper ground-selection gate 70'. The sidewalls of the ground-selection capping pattern 72g' may be aligned with the sidewalls of the upper ground-selection gate 70g' (i.e., the width of the ground-selection capping pattern 72g' may be equal to the third width $W_3'$).

The maximum line width of the ground-selection gate line 80g' may be the width of the lower ground-selection gate 56g' (i.e. the fourth width $W_4$). Thus, the line width of the ground-selection gate line 80g' is reduced as compared to the line width of the ground-selection gate line 80g of the flash memory devices of FIG. 4. This may facilitate providing more highly integrated flash memory devices.

In the embodiments of FIG. 5, the string-selection gate line 80s' comprises a lower string-selection gate 56s' and an upper string-selection gate 70s' that is stacked on the lower string-selection gate 56s'. The lower portion of the upper string-selection gate 70s' is between a pair of the string selection spacers 68s, and may directly contact the lower string-selection gate 56s'. The upper portion of the upper string-selection gate 70s may have a fifth width $W_5$.

The fifth width $W_5$ of the upper string-selection gate 70s' may be narrower than a sixth width $W_6$, which is the width between the outside walls of the pair of string selection spacers 68s. The fifth width $W_5$ may be larger than the minimum interval between the inside walls of the string selection spacers 68s (i.e., the width of the bottom surface of the upper string-selection gate 70s' that contacts the lower string-selection gate 56s'). The sidewalls of the lower string-selection gate 56s' may be aligned to the outside walls of the string selection spacer 68s (i.e., the width of the lower string-selection gate 56s' may be equal to the sixth width $W_6$). Accordingly, the maximum line width of the string selection line 80s' is smaller than the line width of the string selection line 80s in the flash memory devices shown in FIG. 4, which may facilitate providing more highly integrated devices.

A string-selection capping pattern 72s' may be disposed on the upper string-selection gate 70s'. The sidewalls of the string-selection capping pattern 72s' may be aligned to sidewalls of the upper string-selection gate 70s' (i.e., the line width of the string-selection capping pattern 72s' may be the fifth width $W_5$).

The upper ground and string-selection gates 70g' and 70s may be formed of the same material that is used to form the upper control gates 70w. The lower ground and string-selection gates 56g' and 56s may be formed of the same material that is used to form the floating gates 56w.

FIGS. 6 through 12 are cross-sectional diagrams, taken along the line I-I' of FIG. 3, that illustrate methods of fabricating flash memory devices according to embodiments of the present invention.

A field isolation film is formed at predetermined regions in a semiconductor substrate 50 to define active regions 52 (see FIG. 3). The active regions 52 may be line-shaped as shown in FIG. 3.

As shown in FIG. 6, a gate insulation film 54 is formed on the semiconductor substrate 50. A plurality of preliminary floating gates 56 may be formed on the gate insulation film 54 to cover each of the plurality of active regions 52. The preliminary floating gates 56 may be spaced apart from each other and parallel to the active regions 52. The preliminary floating gates 56 may be formed by depositing a floating-gate conductive film on the gate insulation film 54 and then patterning the floating-gate conductive film to form the plurality of preliminary floating gates 56.

In other embodiments of the present invention, the preliminary floating gates 56 may be formed by way of self-alignment on the active regions 52. In particular, the gate insulation film 54 and the floating-gate conductive film may be sequentially deposited on the semiconductor substrate 50. The floating-gate conductive film, the gate insulation film 54 and the semiconductor substrate 50 may then be sequentially patterned to form trenches (not shown in FIG. 6). The patterned floating-gate conductive films on the active regions 52 comprise the preliminary floating gates 56. Field isolation films may then be formed in the trenches. In this manner it is possible to self-align the preliminary floating gates 56 with the active regions. The preliminary floating gates 56 may be formed, for example, of a doped polysilicon. The gate insulation film 54 may be formed, for example, of silicon oxide or some other thermal oxide film.

In some embodiments of the present invention, the gate insulation film 54 may have the same thickness over each active region 52. In other embodiments, the gate insulation film 54 may have a first thickness in the regions where selection transistors are formed and may have a second thickness in regions where cell transistors are formed. For instance, the gate insulation film 54 in the selection transistor regions may be thicker than the gate insulation film 54 in the cell transistor region. A method of forming the gate insulation film 54 with such a structure is as follows. A first insulation film is formed on the active regions 52. The first insulation film is then selectively removed in the cell transistor region. A thermal oxidation process may then be performed on the semiconductor substrate 50 to form a second insulation film. The second insulation film has a different thickness than the first insulation film. The first and second insulation films correspond to the gate insulation film 54. In this manner, a gate insulation film 54 may be formed that has different thicknesses in different regions.

After the gate insulation film 54 and preliminary floating gates 56 are formed, a blocking insulation film 58 and a first conductive film 60 are formed sequentially on the semiconductor substrate 50. The blocking insulation film 58 may comprise, for example, an oxide-nitride-oxide (ONO) layer. In other embodiments, the blocking insulation film 58 may include a high-k dielectric film (e.g., a metallic oxide material such as aluminum oxide or hafnium oxide) having a higher dielectric constant than that of silicon nitride. The first conductive film 60 may comprise, for example, a doped polysilicon layer.

As shown in FIG. 7, the first conductive film 60, the blocking insulation film 58 and the preliminary floating gate 56 may be sequentially patterned to form a source opening 62. The source opening 62 may comprise a groove that intersects the active regions 52. The source opening 62 may expose the gate insulation film 54.

As is also shown in FIG. 7, impurity ions may be implanted into the semiconductor substrate 50 using the patterned first conductive film 60 as a mask to form a common source region 64 in the active region under the source opening 62. The portion of the gate insulation film 54 that is exposed by the source opening 62 may be used as a buffering film during the ion implantation. In other embodiments, the portion of the gate insulation film 54 exposed by the source opening 62 may be removed by, for example, a wet etching process, to expose the active region under the source opening 62. In these embodiments, a buffering insulation film may be formed on the exposed active region, and then the ion implantation process may be performed to form the common source region 64.

As shown in FIG. 8, the first conductive film 60 is further patterned to form a string selection opening 66s and a ground selection opening 66g that each expose the blocking insulation film 58. The string and ground selection openings 66s and 66g are spaced apart from the source opening 62. As shown in FIG. 8, the ground selection opening 66g is closer to the source opening 62 than is the string selection opening 66s.

The string and ground selection openings 66s and 66g may each comprise a groove that interests the active regions 52. In other embodiments of the present invention, the string and ground selection openings 66s, 66g may be hole-shaped. In such embodiments, a plurality of spaced-apart ground selection openings 66g corresponding to respective of the plurality of active regions 52 are arranged along a direction parallel to the source opening 62. Similarly a plurality of spaced-apart string selection openings 66s corresponding to respective of the plurality of active regions 52 are arranged along a direction parallel to the source opening 62.

Referring to FIG. 9, next a first spacer-insulation film may be conformably deposited on the semiconductor substrate 50. The first spacer-insulation film may then be anisotropically etched to form the spacers 68s, 68g and 68m. As shown in FIG. 9, a pair of source spacers 68m are formed on the first and second inside walls of the source opening 62. The opening defined between the source spacers 68m may expose an insulation film (the gate insulation film 54 or the buffering insulation film for the ion-implantation).

A pair of string selection spacers 68s are formed on the first and second inside walls of the string selection opening 66s. A pair of ground selection spacers 68g are formed on the first and second inside walls of the ground selection opening 66g. The openings defined between the pair of the ground selection spacers 68g and between the pair of the string selection spacer 68s expose the blocking insulation film 58.

The spacers 68s, 68g and 68m may be formed of an insulating material having etch selectivity to the insulation film exposed by the hole defined by the pair of source spacers 68m (i.e., the gate insulation film 54 or the buffering insulation film for the ion implantation) and the blocking insulation film 58.

As shown in FIG. 10, the insulation films exposed by the source opening 62 and the string and ground selection openings 662 and 66g may be removed using the first conductive film 60 and the spacers 68s, 68g and 68m as a mask to expose portions of the preliminary floating gate 56 and the common source region 64. Then, a second conductive film 70 is formed on the semiconductor substrate 50 so as to fill the openings between the source spacers 68m, between the string selection spacers 68s, and between the ground selection spacers 68g. As shown in FIG. 10, the lower surface of the second conductive film 70 may directly contact the preliminary floating gate 56 and the common source region 64. The top surfaces of the portions of the second conductive film 70 that fill the openings 62, 66s, and 66g may be lower than the top surface of the remainder of the second conductive film 70. Accordingly, after the second conductive film 70 is formed to a sufficient thickness, the top surface of the second conductive film 70 may be planarized. Thereafter, a capping film 72 may be deposited on the second conductive film 70.

The portion of the second conductive film 70 that contacts the common source region 64 may, for example, be formed of a doped polysilicon. This may allow the second conductive film 70 to form an ohmic contact with the common source region 64. The second conductive film 70 may alternatively or additionally include a low resistivity conductive material such as, for example, a metal (e.g., tungsten or molybdenum), a conductive metal nitride (e.g., titanium nitride or tantalum nitride), or a metal silicide (e.g., as tungsten silicide or cobalt silicide). The capping film 72 may comprise an insulation film, and may also function as a hard mask. In exemplary embodiments of the present invention, the capping film 72 may comprise a silicon oxide film, a silicon oxy-nitride film, and/or a silicon nitride film.

Subsequently, a string-selection mask pattern 74s, a plurality of wordline mask patterns 74w, a ground-selection mask pattern 74g and a source-line mask pattern 74m may be formed on the capping film 72. The mask patterns 74s, 74w, 74g and 74m may be arranged in parallel to each other to cross over the active regions 52, and are spaced-apart from each other. The mask patterns 74s, 74w, 74g and 74m may be formed, for example, using a photoresist film.

The string-selection mask pattern 74s is aligned to the string-selection opening 66s, and the ground-selection mask pattern 74g is aligned to the ground-selection opening 66g. The source-line mask pattern 74m is aligned to the source opening 62. A plurality of wordline mask patterns 74w are arranged between the string-selection mask pattern 74s and the ground-selection mask pattern 74g.

The source-line mask pattern 74m covers the second conductive film 70 between the pair of the source spacers 68m. The width of the source-line mask pattern 74m may be narrower than the width of the source opening 62 (i.e., the distance between the outside walls of the source spacers 68m). The width of the source-line mask pattern 74m may be wider than the distance between the inside walls of the pair of the source spacers 68m.

The ground-selection mask pattern 74g covers the second conductive film 70 between the pair of the ground-selection spacers 68g. The width of the ground-selection mask pattern 74g may be larger than the width of the ground-selection opening 66g (i.e., the distance between the outside walls of the pair of the ground-selection spacers 68g). Thus, the ground-selection mask pattern 74g may cover the pair of the ground-selection spacers 68g, the second conductive film 70 between the pair of the ground-selection spacers 68g, and portions of the first conductive film 60 adjacent the outside walls of the ground-selection spacers 68g.

Similarly, the string-selection mask pattern 74s covers the second conductive film 70 between the pair of string-selection spacers 68s. The width of the string-selection mask pattern 74s may be larger than the width of the string-selection opening 66s (i.e., the distance between the outside walls of the string-selection spacers 68s). Thus, the string-selection mask pattern 74s may cover the pair of the string-selection spacers 68s, the second conductive film 70 between the pair of the string-selection spacers 68s, and portions of the first conductive film 60 adjacent the outside walls of the pair of the string-selection spacers 68s.

The wordline mask patterns 74w each cover portions of the sequentially stacked preliminary floating gate 56, the blocking insulation film 58, the first conductive film 60, the second conductive film 70 and the capping film 72.

The source spacers 68m may be formed of an insulation film having etch selectivity to the second conductive film 70, the first conductive film 60, the blocking insulation film 58 and the preliminary floating gate 56. In certain embodiments of the present invention, the source spacer 68m may be made of silicon nitride or silicon oxy-nitride. As aforementioned, the string and ground selection spacers, 68s and 68g, may be formed of the same material as the source spacers 68m.

As shown in FIG. 11, the capping film 72, the second conductive film 70, the first conductive film 60, the blocking insulation film 58, the preliminary floating gate 56 and the gate insulation film 54 are successively patterned using the mask patterns 74s, 74w, 74g, and 74m as an etch mask. As a result, a number of stacked structures are formed on the semiconductor substrate 50. In particular, a string-selection stacked structure is formed that comprises a string-selection gate-insulation film 54s, a string-selection gate line 80s, a string-selection capping pattern 72s and the string-selection mask pattern 74s. Likewise, a plurality of wordline stacked structures are formed that each comprise a tunnel insulation film 54w, a wordline 80w, a wordline capping pattern 72w and the wordline mask pattern 74w. A ground-selection stacked structure is formed that comprises a ground-selection gate-insulation film 54g, a ground-selection gate line 80g, a ground-selection capping pattern 72g and the ground-selection mask pattern 74g. Finally, a source line stacked structure is formed that comprises a source line 70*m*, a source-line capping pattern 72*m* and the source line mask pattern 74*m*.

The string-selection gate line 80*s*, the wordlines 80*w*, the ground-selection gate line 80*g* and the source line 70*m* may be formed simultaneously by means of a one step photolithography process. Use of such a single step process may facilitate minimizing and/or preventing short circuits between the ground-selection gate line 54*g* and the source line 70*m*.

As is apparent from FIGS. 10 and 11, the string-selection gate-insulation film 54*s*, the tunnel insulation films 54*w* and the ground-selection gate-insulation film 54*g* are formed of portions of the gate insulation film 54.

The source line 70*m* includes a lower portion between the pair of source spacers 68*m*. The lower surface of the lower portion of the source line 70*m* may directly contact the common source region 64. The upper portion of the source line 70*m* protrudes upward from the lower portion. The width of the upper portion of the source line 70*m* is smaller than the distance between the outside walls of the pair of the source spacers 68*m*, but is larger than the width of the bottom surface of the source line 70*m* that contacts the common source region 64.

The source spacers 68*m* may have etch selectivity with respect to the second conductive film 70, the first conductive film 60, the blocking insulation film 58 and the preliminary floating gate 56. Thus, during the etching part of the patterning process, the source spacers 68*m* may function as etch stop layers. Further, as the width of the upper portion of the source line 70*m* is smaller than the interval between the outside walls of the pair of the source spacers 68*m*, the source line 70*m* is self-aligned by the source spacers 68*m*. As shown in FIG. 11, the patterning process removes the capping film 72, the second conductive film 70, the first conductive film 60, the blocking insulation film 58 and the preliminary floating gate 56 from the regions between the source spacer 68*m* and the ground-selection gate line 80*g*.

The width of the upper portion of the source line 70*m* is larger than the width of the lower portion of the source line 70*m*. As a result, the contact area (and hence the contact resistance) between the source line 70*m* and the common source region 64 may be maintained at a desired level even if the source line 70*m* and the pair of source spacers 68*m* are misaligned to a degree.

As is also shown in FIG. 11, a buffering insulation pattern 54*m* may be formed between the source spacer 68*m* and the active regions. The buffering insulation pattern 54*m* may comprise portions of the gate insulation film 54. Otherwise, the buffering insulation pattern 54*m* may comprise portions of a buffering insulation film that was formed in advance of the ion implantation.

The ground-selection gate line 80*g* includes a lower ground-selection gate 56*g* and an upper ground-selection gate 70*g* that are sequentially stacked. The lower ground-selection gate 56*g* comprises a portion of the preliminary floating gate 56, while the upper ground-selection gate 70*g* comprises a portion of the second conductive film 70.

The ground-selection spacers 68*g* are interposed between the lower and upper ground-selection gates 56*g* and 70*g*. A lower portion of the upper ground-selection gate 70*g* is between the ground selection spacers 68*g* and may directly contact the lower ground-selection gate 56*g*. The width of the upper portion of the upper ground-selection gate 70*g* is larger than the width of the ground selection opening 66*g*. Thus, the upper portion of the upper ground-selection gate 70*g* covers the ground selection spacers 68*g*. A first conductive pattern 60*g* is formed between the lower and upper ground-selection gates 56*g* and 70*g*. The first conductive pattern 60*g* may comprise portions of the first conductive film 60. As shown in FIG. 11, the first conductive pattern 60*g* covers the outside walls of the ground selection spacer 68*g*. A first insulation pattern 58*g* may be formed between the first conductive pattern 60*g* and the lower ground-selection gate 56*g* and between the ground selection spacer 68*g* and the lower ground-selection gate 56*g*. The first insulation pattern 58*g* may comprise a portion of the blocking insulation film 58.

The string-selection gate line 80*s* includes a lower string-selection gate 56*s* and an upper string-selection gate 70*s* that is stacked on the lower string-selection gate 56*s*. The lower string-selection gate 56*s* may comprise a portion of the preliminary floating gate 56. The upper string-selection gate 70*s* may comprise a portion of the second conductive film 70.

The string-selection spacers 68*s* are interposed between the lower and upper string-selection gates 56*s* and 70*s*. A lower portion of the upper string-selection gate 70*s* may fill the space between the pair of string selection spacers 68*s*, and may directly contact the lower string-selection gate 56*s*. The upper portion of the upper string-selection gate 70*s* covers the string selection spacers 68*s*. A second conductive pattern 60*s* is formed between the lower and upper string-selection gates 56*s* and 70*s*. The second conductive pattern 60*s* may comprise a portion of the first conductive film 60. The second conductive pattern 60*s* covers the outside walls of the string selection spacers 68*s*. A second insulation pattern 58*s* may be formed between the second conductive pattern 60*s* and the lower string-selection gate 56*s* and between the string selection spacers 68*s* and the lower string-selection gate 56*s*. The second insulation pattern 58*s* may comprise a portion of the blocking insulation film 58.

Each wordline 80*w* includes a floating gate 56*w*, a blocking insulation pattern 58*w* and a control gate electrode 76 that are stacked sequentially. The control gate electrode 76 includes a lower control gate 60*w* and an upper control gate 70*w* that are stacked sequentially. The floating gates 56*w* may each comprise a portion of the preliminary floating gate 56*w*. Each block insulation pattern 58*w* may comprise a portion of the blocking insulation film 58. Each lower control gate 60*w* may comprise a portion of the first conductive film 60, while each upper control gate 70*w* may comprise a portion of the second conductive film 70. Each floating gate 56*w* is disposed over the active region, with the tunnel insulation film 54*w* interposed therebetween. The control gate electrode 76 intersects the floating gate 56*w*, and the blocking insulation pattern 58*w* is disposed between the control gate electrode 76 and the floating gate 56*w*.

Next, the mask patterns 74*s*, 74*w*, 74*g* and 74*m* are removed. The mask patterns 74*s*, 74*w*, 74*g* and 74*m* may be removed after forming the lines 80*s*, 80*w*, 80*g*, and 70*m*. In other embodiments, the mask patterns, 74*s* 74*w*, 74*g* and 74*m* may be removed after forming the capping patterns 72*s*, 72*w*, 72*g* and 72*m*. As discussed above, the capping patterns 72*s*, 72*w*, 72*g* and 72*m* are formed by etching the capping film 72 using the mask patterns 74*s*, 74*w*, 74*g*, and 74*m* as a mask. Then, the mask pattern 74*s*, 74*w*, 74*g* and 74*m* are removed. The capping patterns 72*s*, 72*w*, 72*g* and 72*m* may then be used as a hard mask to selectively etch the second conductive film 70, the first conductive film 60, the blocking insulation film 58, the preliminary floating gate 56, and the gate insulation film, in order, resulting in the lines 80*s*, 80*w*, 80*g*, and 70*m*.

Figure 12:
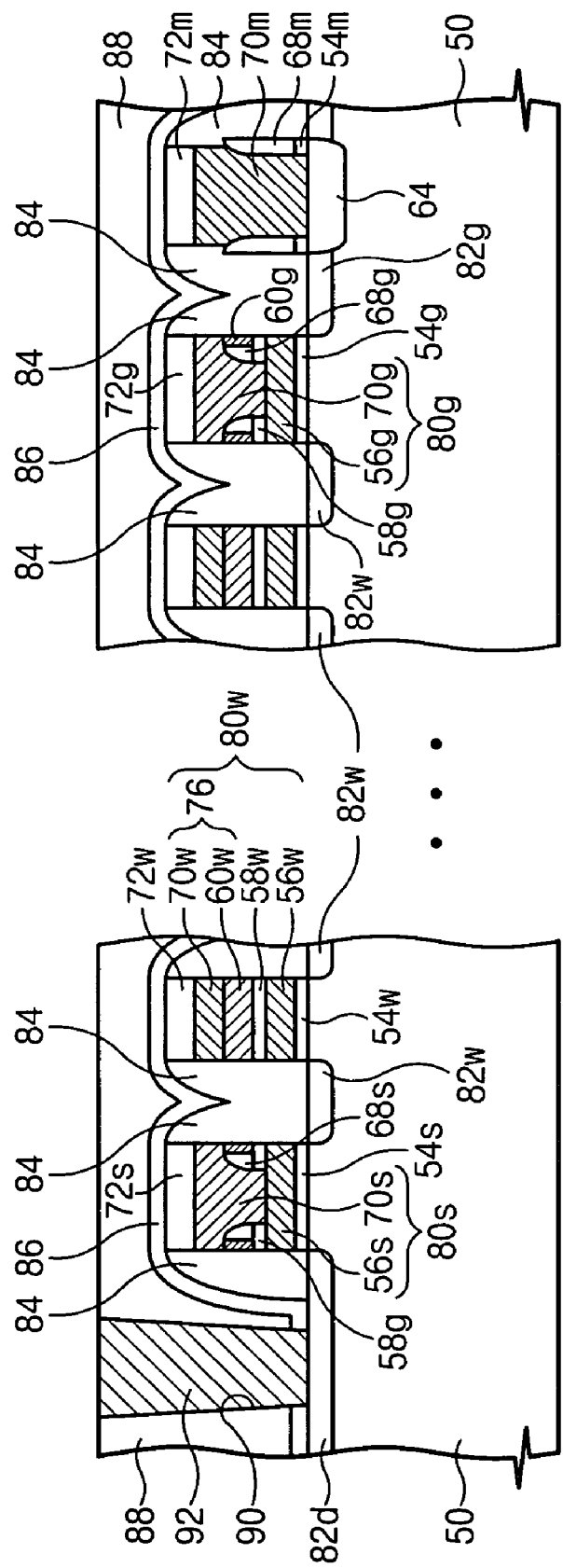

Referring to FIG. 12, impurity ions are implanted into the active regions using the lines 80*s*, 80*w*, 80*g* and 70*m*, the capping patterns 72*s*, 72*w*, 72*g* and 72*m*, and the source spacers 68*m* as a mask, so that impurity diffusion regions 82*d*, 82*w* and 82*g* are formed in the active region 52. The impurity diffusion region 82d, which is formed at a side of the string-selection gate line 80s opposite the wordlines 80w, corresponds to a common drain region 82d. The impurity diffusion regions 82w formed at both sides of the wordlines 80w correspond to the cell source/drain regions 82w. The impurity diffusion region 82g formed between the source line 70m and the ground-selection gate line 80g corresponds to the ground-selection source/drain region 82g. The ground-selection source/drain region 82g connects the common source region 64 with the ground-selection channel region that is defined under the ground-selection gate line 80g. Thus, when the ground selection transistor is turned on, the ground-selection source/drain region 82g electrically connects a channel in the ground-selection channel region to the common source region 64.

As the source spacers 68m are used as etch-stopping layers, the portions of the capping film, the second conductive film 70, the first conductive film 60, the blocking insulation film 58 and the preliminary floating gate 56 between the ground-selection gate line 80g and the source spacers 68m is removed. Thus, the impurity ions are implanted into the active region between the ground-selection gate line 80g and the common source region 64.

In other words, the common source region 64 is aligned to the source opening 62, and the pair of the source spacers 68m are also aligned also to the source opening 62. Thus, the pair of the source spacers 68m are settled over the top edges of the common source region 64 with self-alignment thereon. In addition, as the source spacers 68m are used as etch-stop layers, all of the films 72, 70, 60, 58, 56 between the source spacers 68m and the ground-selection gate line 80g are removed while being self-aligned to the source spacers 68m, and the impurity ions are implanted into the active region while being self-aligned by the gate line 80g and the source line 70m. As a result, the ground-selection source/drain region 82g is self-aligned to a side of the common source region 64. Thus, the source line 70m is connected to the channel under the ground-selection gate line 80g without electrical disconnection.

Next, a second spacer-insulation film may be conformably deposited on the semiconductor substrate 50 and selectively etched away in an anisotropical mode to form the gate spacers 84 on sidewalls of the lines 80s, 80w, 80g and 70m and the capping patterns 72s, 72w, 72g and 72m. If the intervals among the lines 80s, 80w 80g, and 70m are narrow, the gate spacers 84 may contact each other, as shown in FIG. 12. Although not shown, the gate spacers 82 may be also formed on both sidewalls of gate electrodes of peripheral circuit transistors.

Next, a diffusion-protecting insulation film 86 may be formed over the semiconductor substrate 50. The diffusion-protecting insulation film 86 may block mobile charges that would be induced from a subsequent processing step. In certain embodiments of the present invention, the diffusion-protecting insulation film 86 may comprise a silicon nitride film or a silicon oxy-nitride film. Thereafter, an interlevel insulation film 88 may be deposited on the diffusion-protecting insulation film 86. The interlevel insulation film 88 may comprise, for example, a silicon oxide film.

The interlevel insulation film 88 and the diffusion-protecting insulation film 86 may be sequentially patterned to form a bitline contact hole 90 that exposes the common drain region 82d. A contact plug 92 may be formed in the bitline contact hole 90. A bitline 94 (see FIG. 4) is formed on the interlevel insulation film 88 to complete the flash memory device.

In the flash memory devices of FIG. 4, the source line 70m comprises a portion of the second conductive film 70 that fills the source opening 62. In such embodiments, the top surface of the source line 70m may be lower than the top surfaces of the selection gate lines 80s and 80g and the wordlines 80w, thereby reducing and/or minimizing any increase in the aspect ratio of the bitline contact hole. Further, as the source line 70m may be formed at the same time that the selection gate lines 80s and 80g and the wordlines 80w are formed, the possibility of a short circuit developing between the ground-selection gate line 80g and the source line 70m due to the mis-alignment of the conventional source line may be reduced.

Figure 13:
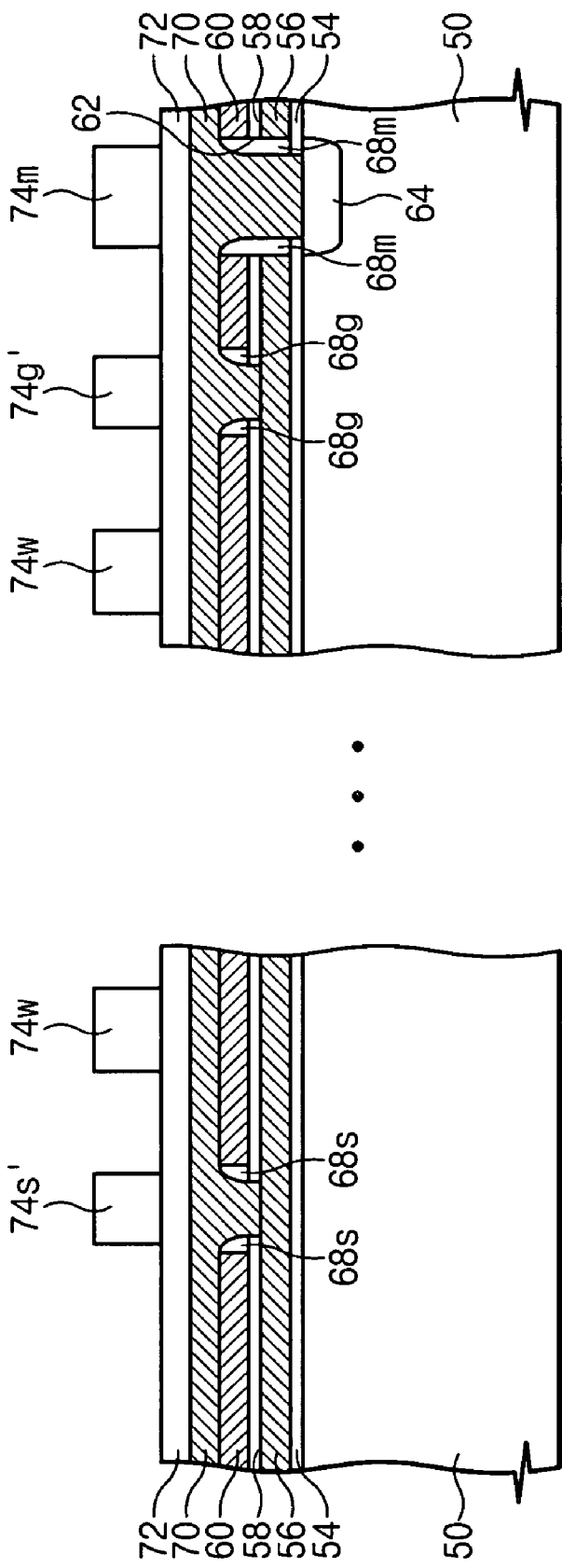
FIG. 13 is a cross-sectional diagram, taken along the line I-I' of FIG. 3, illustrating processing steps of fabricating the flash memory device of FIG. 5.

FIG. 13 is a cross-sectional diagram, taken along with the line I-I' of FIG. 3, illustrating processing steps for fabricating the flash memory device shown in FIG. 5.

Referring to FIG. 13, a string-selection mask pattern 74s', wordline mask patterns 74w, a ground-selection mask pattern 74g' and a source-line mask pattern 74m are formed on the capping film 72. The wordline mask pattern 74w and the source-line mask pattern 74m are formed by way of the same procedure as described above with respect to FIG. 10.

The string-selection mask pattern 74s' has a width that is smaller than the width of the string selection opening 66s. The width of the string-selection mask pattern 74s' may, however, be larger than the minimum distance between the inside walls of the pair of the string selection spacers 68s. Thus, the string-selection mask pattern 74s' covers the second conductive film 70 between the pair of the string selection spacers 68s, and partial portions of the string selection spacers 68s.

The ground-selection mask pattern 74g' has a width that is smaller than the width of the ground selection opening 66g. The width of the ground-selection mask pattern 74g' may, however, be larger than the minimum distance between the inside walls of the pair of the ground selection spacers 68g. Thus, the ground-selection mask pattern 74g' covers the second conductive film 70 between the pair of ground selection spacers 68g, and partial portions of the ground selection spacers 68g.

After the mask patterns 74s', 74w, 74g' and 74m are formed, the capping film 72, the second conductive film 70, the first conductive 60, the blocking insulation film 58, the preliminary floating gate 56, and the gate insulation film 54 are successively etched using the mask patterns 74s', 74w', 74g' and 74m as an etch mask. The string and ground selection spacers 68s and 68g may be formed of the same material as the source spacers 68m. Thus, the string and ground selection spacers 68s and 68g act as etch-stopping layers like the source spacers 68m. This etching process exposes the outside walls of the string and ground selection spacers 68s and 68g.

The string and ground-selection gate lines 80s' and 80g', and the string and ground-selection capping patterns 72s' and 72g' illustrated in FIG. 5 are formed by the etching process.

The subsequent processing steps may be carried out as same as those aforementioned. As a result, the flash memory device shown in FIG. 5 is completed.

According to the aforementioned methods, the string and ground selection spacers 68s and 68g may be used as etch-stop layers in forming the string and ground-selection gate lines 80s' and 80g'. Thus, the maximum line width of the selection gate line 80s' or 80g' is defined within the widths of the interval between the outside walls of the string and ground selection spacers 68s and 68g, respectively. As a result, the line widths of the selection gate lines 80s' and 80g' may be reduced.

In a conventional NAND-type flash memory device (see FIGS. 1 and 2), the source line 11 may be higher than the gate lines 3s, 3a, and 3g which may result in an increase in the aspect ratio of the bitline contact hole 15. As the aspect ratio of the bitline contact hole 15 increases, various problems may arise such as an increase in the contact resistance due to a reduction of the exposed area by the bitline contact hole 15. Pursuant to embodiments of the present invention, the top surface of the source line is at the same height as, or lower than, the top surfaces of the string-selection gate line, the ground-selection gate line, and the wordlines, thereby reducing and/or minimizing any increase in the aspect ratio of the bitline contact hole.

Figure 2:
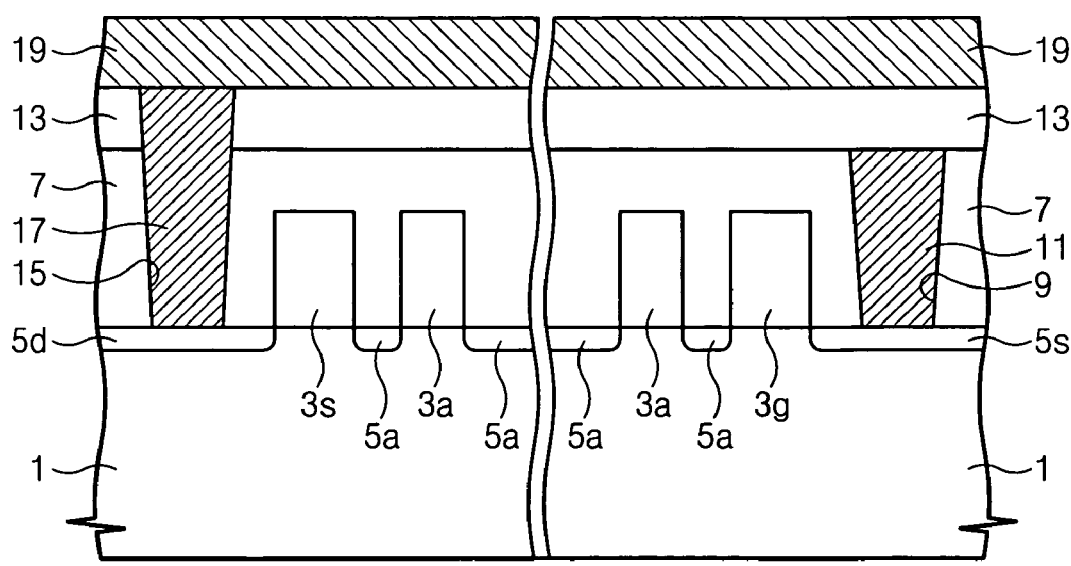

Moreover, in the conventional NAND-type flash memory device of FIGS. 1 and 2, the source line 11 fills the opening 9 that is formed by patterning the first interlayer oxide film 7. If the opening 9 is not properly aligned, the source line 11 and the adjacent ground-selection gate line 3g may be short-circuited. Pursuant to embodiments of the present invention, the source line is patterned together with the selection gate lines and the wordlines. This may reduce the possibility of a short circuit being generated between the source line and the ground-selection gate line.

While the present invention has been described in connection with the embodiment of the present invention illustrated in the accompanying drawings, it is not limited thereto. It will be apparent to those skilled in the art that various substitution, modifications and changes may be made thereto without departing from the scope and spirit of the present invention.

What is claimed is:

1. A flash memory device comprising:
   at least one active region in a semiconductor substrate;
   a string-selection gate line that crosses over the active region;
   a ground-selection gate line that crosses over the active region;
   a plurality of wordlines that cross over the active region between the string-selection gate line and the ground-selection gate line;
   a common source region in the active region at a first side of the ground-selection gate line; and
   a first source spacer that crosses over a first top edge region of the common source region and a second source spacer that crosses over a second lop edge region of the common source region;
   a source line between the first source spacer and the second source spacer that is electrically connected to the common source region,
   wherein a height of a top surface of the source line above the semiconductor substrate is less than or equal to a height of a top surface of the ground-selection gate line above the semiconductor substrate
   wherein the width of an upper portion of the source line is less than a distance between an outside wall of the first source spacer and an outside wall of the second source spacer, and greater than a minimum width between an inside wall of the first source spacer and an inside wall of the second source spacer.

2. A flash memory device comprising:
   at least one active region in a semiconductor substrate;
   a string-selection gate line that crosses over the active region;
   a ground-selection gate line that crosses over the active region;
   a plurality of wordlines that cross over the active region between the string-selection gate line and the ground-selection gate line;
   a common source region in the active region at a first side of the ground-selection gate line; and
   a first source spacer that crosses over a first top edge region of the common source region and a second source spacer that crosses over a second top edge region of the common source region;
   a source line between the first source spacer and the second source spacer that is electrically connected to the common source region,
   wherein a height of a top surface of the source line above the semiconductor substrate is less than or equal to a height of a top surface of the ground-selection gate line above the semiconductor substrate;
   wherein the ground-selection gate line comprises an upper ground-selection gate stacked on a lower ground-selection gate, wherein the string-selection gate line comprises an upper string-selection gate stacked on a lower string-selection gate, and wherein the upper string-selection gate and the upper ground-selection gate and the source line are all formed of the same material;
   a first ground selection spacer and a second ground selection spacer that is spaced apart from the first ground selection spacer, the first and second ground selection spacers on the lower ground-selection gate;
   a first string selection spacer and a second string selection spacer that is spaced apart from the first string selection spacer, the first and second string selection spacers on the lower string-selection gate,
   wherein the first and second ground-selection spacers, the first and second string-selection spacers and the first and second source spacers are all formed of the same material,
   wherein a lower portion of the upper ground-selection gate is between the first and second ground-selection spacers and electrically connected to the lower ground-selection gate,
   and wherein a lower portion of the upper string-selection gate is between the first and second string-selection spacers and electrically connected to the lower string-selection gate
   wherein an upper portion of the upper ground-selection gate is wider than a distance between an outside wall of the first ground selection spacer and an outside wall of the second ground selection spacer, and wherein an upper portion of the upper string-selection gate is wider than a distance between an outside wall of the first string-selection spacer and an outside wall of the second string selection spacer.

3. The flash memory device of claim 2, further comprising:
   a first conductive pattern between the lower ground-selection gate and the upper ground-selection gate, the first conductive pattern covering the outside wall of the first ground selection spacer;
   a second conductive pattern between the lower ground-selection gate and the upper ground-selection gate, the second conductive pattern covering the outside wall of the second ground selection spacer;
   a third conductive pattern between the lower string-selection gate and the upper string-selection gate, the third conductive pattern covering the outside wall of the first string selection spacer; and
   a fourth conductive pattern between the lower string-selection gate and the upper string-selection gate, the fourth conductive pattern covering the outside wall of the second string selection spacer.

4. The flash memory device of claim 3, further comprising:
   a first insulation pattern between the first and second source spacers and the common source region;

a second insulation pattern between the first ground selection spacer, the second ground selection spacer, the first conductive pattern and the second conductive pattern and the lower ground-selection gate; and a third insulation pattern between the first string selection spacer, the second string selection spacer, the third conductive pattern and the fourth conductive pattern and the lower string-selection gate.

5. The flash memory device of claim 2, wherein an upper portion of the upper ground-selection gate is narrower than a distance between an outside wall of the first ground selection spacer and an outside wall of the second ground selection spacer, and wider than a minimum distance between an inside wall of the first ground selection spacer and an inside wall of the second ground selection spacer, wherein an upper portion of the upper string-selection gate is narrower than a distance between an outside wall of the first string selection spacer and an outside wall of the second string selection spacer, and wider than a minimum distance between an inside wall of the first string selection spacer and an inside wall of the second string selection spacer, and wherein the lower ground-selection gate has a first sidewall that is aligned with the outside wall of the first ground selection spacer, wherein the lower ground-selection gate has a second sidewall that is aligned with the outside wall of the second ground selection spacer, wherein the lower string-selection gate has a first sidewall that is aligned with the outside wall of the first string selection spacer, and wherein the lower string-selection gate has a second sidewall that is aligned with the outside wall of the second string selection spacer.

6. A flash memory device comprising:

at least one active region in a semiconductor substrate;

a string-selection gate line that crosses over the active region;

a ground-selection gate line that crosses over the active region;

a plurality of wordlines that cross over the active region between the stung-selection gate line and the ground-selection gate line;

a common source region in the active region at a first side of the ground-selection gate line;

a source line that is electrically connected to the common source region; and a first source spacer that crosses over a first top edge region of the common source region and a second source spacer that crosses over a second top edge region of the common source region, wherein a lower portion of the source line is between the first source spacer and the second source spacer;

wherein the width of an upper portion of the source line is less than a distance between an outside wall of the first source spacer and an outside wall of the second source spacer, and greater than a minimum width between air inside wall of the first source spacer and an inside wall of the second source spacer.

7. The flash memory device of claim 6, wherein a height of a top surface of the source line above the semiconductor substrate is less than or equal to a height of a top surface of the ground-selection gate line above the semiconductor substrate.

* * * * *

UNITED STATES PATENT AND TRADEMARK OFFICE
CERTIFICATE OF CORRECTION

PATENT NO.       : 7,476,928 B2                                           Page 1 of 1
APPLICATION NO.  : 11/358897
DATED            : January 13, 2009
INVENTOR(S)      : Kim It is certified that error appears in the above-identified patent and that said Letters Patent is hereby corrected as shown below:

Column 19, Claim 1, Line 42:  Please correct "lop" to read -- top --

Column 22, Claim 6, Line 8:  Please correct "stung" to read -- string --

Column 22, Claim 6, Line 23:  Please correct "air" to read -- an --

Signed and Sealed this

Third Day of March, 2009

JOHN DOLL
*Acting Director of the United States Patent and Trademark Office*